(12) United States Patent
Kipnis et al.

(10) Patent No.: US 7,612,684 B2
(45) Date of Patent: Nov. 3, 2009

(54) DUAL MODE RF POWER AMPLIFIER

(75) Inventors: Issy Kipnis, Berkeley, CA (US); Daniel Bjork, Sollentuna (SE); Jan Rapp, Hasselby (SE)

(73) Assignee: Intel Corporation, Santa Clara, CA (US)

( * ) Notice: Subject to any disclaimer, the term of this patent is extended or adjusted under 35 U.S.C. 154(b) by 350 days.

(21) Appl. No.: 11/767,223

(22) Filed: Jun. 22, 2007

(65) Prior Publication Data

US 2008/0315993 A1      Dec. 25, 2008

(51) Int. Cl.
*G08B 23/00*      (2006.01)
(52) U.S. Cl. ............... 340/693.1; 340/572.1; 340/635; 340/654; 340/657; 340/10.1
(58) Field of Classification Search ............. 340/572.1, 340/693.1, 635, 654, 657, 10.1; 342/42, 342/44, 50, 51
See application file for complete search history.

(56) References Cited

U.S. PATENT DOCUMENTS 5,550,548 A * 8/1996 Schuermann ................ 342/42
2005/0261564 A1 * 11/2005 Ryu et al. ................... 600/388
2007/0236336 A1 * 10/2007 Borcherding ............ 340/10.34
2008/0238626 A1 * 10/2008 Rofougaran et al. ....... 340/10.1

* cited by examiner

*Primary Examiner*—Hung T. Nguyen
(74) *Attorney, Agent, or Firm*—Kenneth J. Cool; Cool Patent, P.C.

(57) ABSTRACT

Briefly, in accordance with one or more embodiments, a dual mode power amplifier is capable of operating in either linear mode such as class A operation, or a non-linear mode such as class F operation. The power amplifier may be utilized in an RFID interrogator. The power amplifier may be biased to operate in a linear mode if the power amplifier is operating in a higher linearity mode, or may be biased to operate in a non-linear mode if the power amplifier is operating in a higher efficiency, lower power mode. The power amplifier may comprise two or more amplifiers coupled in parallel. A current mirror circuit may turn on more amplifiers if the power amplifier is operating in a higher power mode, and may turn on fewer amplifiers if the power amplifier is operating a lower power mode.

13 Claims, 2 Drawing Sheets

DUAL MODE RF POWER AMPLIFIER

BACKGROUND

Figure 1:
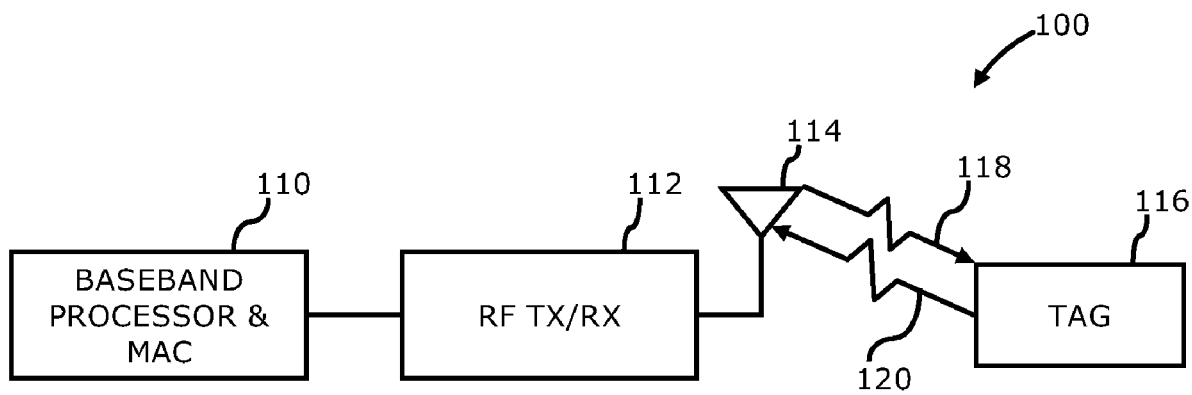

Currently, wireless systems that benefit from power amplifiers operating in different modes are implemented by providing two distinct amplifiers and using one or the other alternatively. However, using two distinct amplifiers results in cost and space penalties. For example, if the power amplifiers are integrated in a semiconductor, then approximately twice the die area is needed. If the power amplifiers are discrete, then two separate devices are needed with cost and board area implications. Furthermore, in current arrangements when two power amplifiers are used, the outputs of the amplifiers are combined via a switch, combiner, coupler, diplexer or some other such device, to drive the subsequent stage or the antenna.

DESCRIPTION OF THE DRAWING FIGURES

Figure 2:
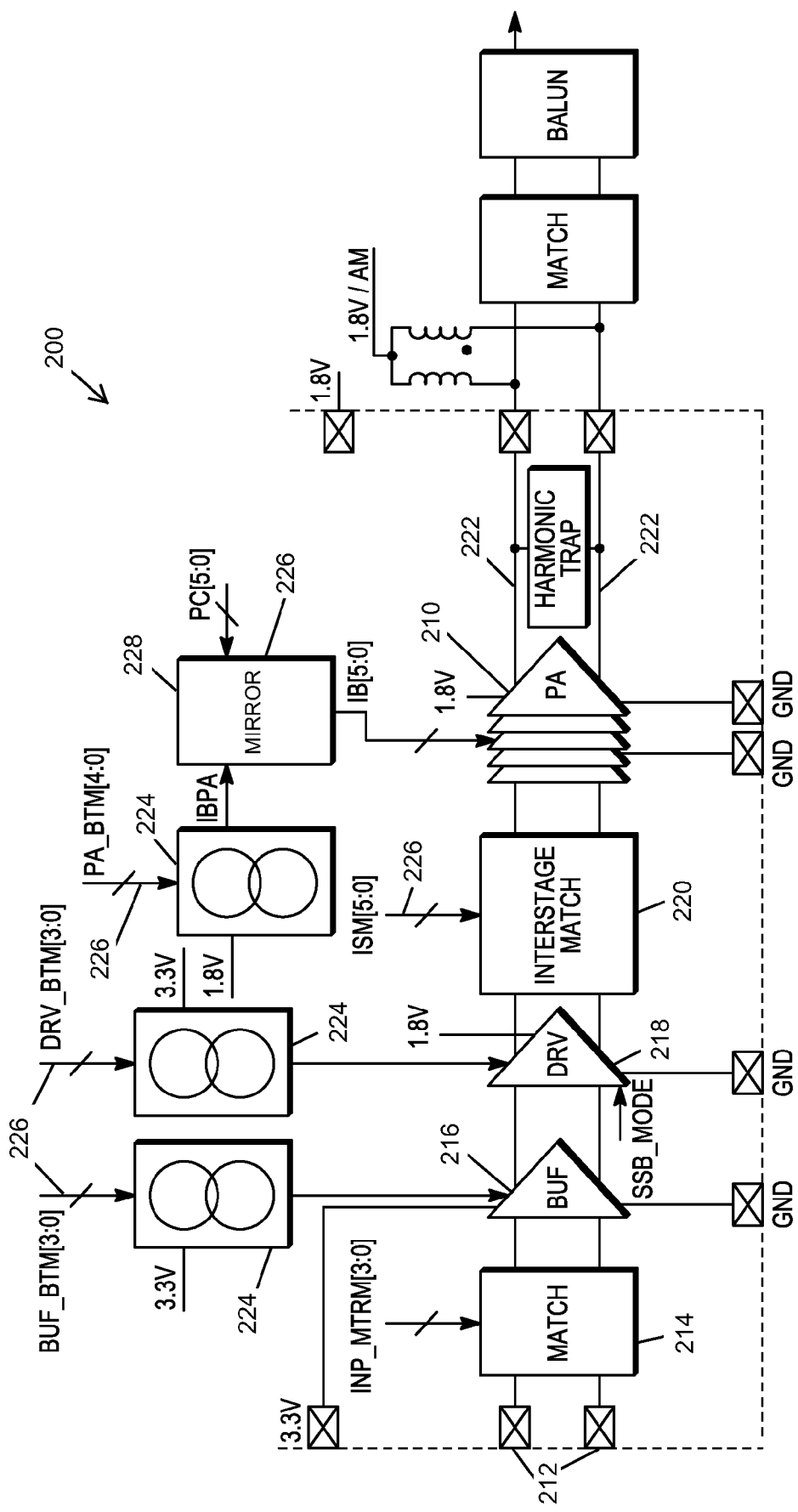

Claimed subject matter is particularly pointed out and distinctly claimed in the concluding portion of the specification. However, such subject matter may be understood by reference to the following detailed description when read with the accompanying drawings in which:

FIG. 1 is a block diagram of a radio-frequency identification (RFID) interrogator in accordance with one or more embodiments; and FIG. 2 is a diagram of a dual mode amplifier in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect. In the following description and/or claims, the terms "comprise" and "include," along with their derivatives, may be used and are intended as synonyms for each other.

Referring now to FIG. 1, a block diagram of a radio-frequency identification (RFID) interrogator in accordance with one or more embodiments will be discussed. RFID interrogator 100 is one example system that is capable of utilizing a dual mode power amplifier 200 as shown in and described with respect to FIG. 2, which may be a part of radio-frequency (RF) transceiver 112. As shown in FIG. 1, RFID interrogator 100 generally may comprise a baseband processor and media access controller (MAC) 110 coupled to an RF transceiver 112 having a transmitter path and a receiver path. In one or more embodiments, baseband processor and media access controller 110 may comprise two or more discrete components or integrated circuits, and/or may comprise a single integrated circuit or processor, although the scope of the claimed subject matter is not limited in these respects. In one or more embodiments, baseband processor and MAC 110 may generate an interrogation waveform that is transmitted by RF transceiver 112 via antenna 114 as an interrogation signal 118. Interrogation signal 118 may be received by RFID tag 116 and may provide operational power to RFID tag 116 so that RFID tag 116 may transmit a tag response signal 120 back to RFID interrogator 100. The received tag response signal 120 may be demodulated and/or decoded by baseband processor and MAC 110 in order to determine information stored in tag 116, for example an identification code corresponding to tag 116. However, this is merely one example of the operation of RFID interrogator 100, and the scope of the claimed subject matter is not limited in this respect.

Referring now to FIG. 2, a diagram of a dual mode amplifier in accordance with one or more embodiments will be discussed. In one or more embodiments, as shown in FIG. 2 power amplifier 200 comprises a three stage amplifier with inter-stage matching and programmable bias and tuning setting. By properly adjusting the controls, power amplifier 200 may be configured for either class A or class F operation. However, these are merely example classes of operation, and the scope of the claimed subject matter is not limited in this respect.

In one or more embodiment, power amplifier 200 may comprise the power amplifier circuit of the transmitter section of radio-frequency transceiver 112 as shown in FIG. 1. Power amplifier 200 may comprise multiple amplifiers 210 coupled in parallel and arranged to receive a differential signal at differential inputs 212. It should be noted that although power amplifier 200 shown in FIG. 1 is a differential amplifier, in one or more embodiments power amplifier 200 may also be implemented as a single-ended amplifier, and the scope of the claimed subject matter is not limited in this respect. The differential signal is applied to a matching impedance network 214, passed through a buffer stage 216, a driver stage, and an interstage matching network 220 before being applied to the inputs of the multiple amplifiers 210. The multiple amplifiers 210 include differential outputs coupled in parallel to provide a combined differential output 222 for power amplifier 200. Current sources 224 provide operational current to power amplifier 200 where current sources 224 may be controlled via control inputs 226. A current mirror circuit 228 further provides a current source to the multiple amplifiers 210 such that a selected number of amplifiers in the multiple amplifiers may be turned on or off via control input 226 to current mirror 228, although the scope of the claimed subject matter is not limited in this respect.

As shown in FIG. 2, the control inputs 226 may change the bias of the circuits of power amplifier 200 to select operation of power amplifier 200 in a linear mode which by definition is class A operation. Alternatively, the bias of the circuits of power amplifier 200 may be selected to operate power amplifier 200 in a non-linear mode such as a class C mode or class F mode, and so on depending on the amount of non-linearity selected via control inputs 226. Class F by definition does not short the third harmonic at the load. In one or more embodiments, if power amplifier 200 is operating in a non-linear mode, control inputs 226 cause power amplifier 200 to operate in a class F mode, although the scope of the claimed subject matter is not limited in this respect.

In one or more embodiments, power amplifier 200 may be biased to operate in a linear, or class A mode, if RFID interrogator 100 is operating in a fixed mode such as when receiving power from an alternating-current (ac) source such at that provide by a wall outlet. In one or more embodiments, power amplifier 200 may be biased to operate in a non-linear mode, such as class F operation, if RFID interrogator 100 is operating in a mobile, portable or hand-held mode such as when receiving power from a battery source. It should be noted that non-linear mode is a more efficient mode of operation than non-linear mode, and therefore non-linear mode may be more suitable for portable, hand-held type operation where power may be supplied from a battery. Non-linear mode may also be utilized in a fixed mode operation where power may be supplied from a wall outlet, however in such modes linear mode is generally utilized to achieve a greater power output where power consumption may be less of an issue than in a battery operated situation. However, these are merely examples of where a linear mode or a non-linear mode may be utilized, and the scope of the claimed subject matter is not limited in these respects. In one or more alternative embodiments, power amplifier 200 may be biased to operate in a non-linear mode, such as class F operation, if RFID interrogator 100 is operating in a power over Ethernet (POE) mode such as when receiving power via a network or other input where the operational power may be constrained or limited. However, these are merely examples of how power amplifier 200 may operate in a linear or a non-linear mode based at least in part on the power provided to RFID reader, and the scope of the claimed subject matter is not limited in these respects.

In one or more embodiments, operation of power amplifier 200 may utilize a higher number of the multiple power amplifiers 210 when power amplifier 200 is operating in a linear mode such as class A, and may utilize a lower number of the power amplifiers 210 when operating in a non-linear mode such as class F. Thus, a trade off may be made between performance (i.e., power) and efficiency by biasing power amplifier 200 to operate in a linear mode and/or by turning on more of the multiple amplifiers 210 to achieve a higher level of performance and/or power, or by biasing power amplifier 200 to operate in a non-linear mode to achieve a higher level of efficiency of amplifier 200. It should be noted that turning on more or fewer of the multiple amplifiers may be used to increase or decrease the output power of power amplifier 200, and that changing the bias of power amplifier 200 may be used to change the efficiency of power amplifier 200. In one or more embodiments, power amplifier 200 may be disposed on a single integrated circuit that may be utilized in RFID interrogator 100 in multiple applications such as a fixed RFID interrogator 100 or a portable RFID interrogator 100, although the scope of the claimed subject matter is not limited in this respect.

In one or more embodiments, power amplifier 200 comprises a radio-frequency (RF) amplifier capable of operating in two or more different modes. In one mode, power amplifier 200 is capable of operating in linear mode biased in class A where the collector current and voltage waveforms have a 100% conduction angle, or near 100% conduction angle. In a second mode, power amplifier 200 is capable of operating in class F non-linear mode. In such a mode, power amplifier 200 is biased for 50% conduction angle collector current, or near 50% conduction angle collector current. In one or more embodiments, harmonic termination circuitry shorts all harmonics except for the third which is fixed to a certain level resulting in the collector voltage being slightly squared sinewave which in turn increases the efficiency of power amplifier 200. In communication systems that use a constant amplitude modulation, operating power amplifier 200 in a class F mode will result in significantly higher efficiency compared to operation in class A. Power amplifier 200 will also operate at higher efficiency when power amplifier 200 is utilized in communications systems that utilize a modulation approach other than a conventional IQ modulation, although the scope of the claimed subject matter is not limited in these respects.

In one or more embodiments, power amplifier 200 may be implemented as part of an integrated silicon transceiver for RFID reader applications such as shown in and described with respect to FIG. 1. Such an arrangement of power amplifier 200 as shown in and described with respect to FIG. 2 allows the selection of two modes of operation for power amplifier 200 without requiring additional components, cost or complexity. Although FIG. 1 shows an example RFID transceiver in which power amplifier 200 may be utilized, in one or more alternative embodiments power amplifier 200 may also be utilized in other wireless systems, for example cellular systems, wireless fidelity (Wi-Fi) systems in accordance with a Wi-Fi Alliance standard, Worldwide Interoperability for Microwave Access (WiMAX) systems in accordance with a WiMAX Forum standard, and so on, and or any system that is capable of benefiting from a dual mode power amplifier. However, these are merely example applications for power amplifier 200, and the scope of the claimed subject matter is not limited in these respects.

Although the claimed subject matter has been described with a certain degree of particularity, it should be recognized that elements thereof may be altered by persons skilled in the art without departing from the spirit and/or scope of claimed subject matter. It is believed that the subject matter pertaining to a dual mode RF power amplifier and/or many of its attendant utilities will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A power amplifier, comprising: two or more power amplifiers coupled in parallel; and a current source capable of providing operational current to the two or more power amplifiers; wherein the current source is capable of biasing the two or more amplifiers in a linear mode if operating the power amplifier in a higher linearity mode, and biases the two or more amplifiers in a non-linear mode if operating the power amplifier in a higher efficiency mode; further comprising a current mirror circuit capable of turning on a greater number of the two or more power amplifiers if operating the power amplifier in a higher power mode, and capable of turning on a lower number of the two or more power amplifiers if operating the power amplifier in a lower power mode.

2. A power amplifier as claimed in claim 1, wherein the current source biases the two or more amplifiers in class A operation if operating the power amplifier in a higher linearity mode.

3. A power amplifier as claimed in claim 1, wherein the current source biases the two or more amplifiers in F operation if operating the power amplifier in higher efficiency mode.

4. A power amplifier as claimed in claim 1, wherein the two or more amplifiers and the current source are disposed on a single integrated circuit.

5. A power amplifier as claimed in claim 1, further comprising a current mirror circuit capable of turning on a greater number of the two or more power amplifiers if operating the power amplifier in a higher power mode, and capable of turning on a lower number of the two or more power amplifiers if operating the power amplifier in a lower power mode, wherein the two or more amplifiers and the current source are disposed on a single integrated circuit.

6. A power amplifier as claimed in claim 1, wherein the current source is capable of biasing the two or more amplifiers in a linear mode if the power amplifier is operating in a fixed mode of operation.

7. A power amplifier as claimed in claim 1, wherein the current source is capable of biasing the two or more amplifiers in a non-linear mode if the power amplifier is operating in a portable mode of operation.

8. An RFID interrogator, comprising: a media access controller; and a radio-frequency transceiver coupled to the media access controller, the radio-frequency transceiver comprising power amplifier coupled to at least one antenna, the power amplifier comprising: two or more power amplifiers coupled in parallel; and a current source capable of providing operational current to the two or more power amplifiers; wherein the current source is capable of biasing the two or more amplifiers in a linear mode if operating the power amplifier in a higher linearity mode, and biases the two or more amplifiers in a non-linear mode if operating the power amplifier in a higher efficiency mode; further comprising a current mirror circuit capable of turning on a greater number of the two or more power amplifiers if operating the power amplifier in a higher power mode, and capable of turning on a lower number of the two or more power amplifiers if operating the power amplifier in a lower power mode.

9. An RFID interrogator as claimed in claim 8, wherein the current source biases the two or more amplifiers in class A operation if operating the power amplifier in a higher linearity mode.

10. An RFID interrogator as claimed in claim 8, wherein the current source biases the two or more amplifiers in F operation if operating the power amplifier in higher efficiency mode.

11. An RFID interrogator as claimed in claim 8, wherein the two or more amplifiers and the current source are disposed on a single integrated circuit.

12. An RFID interrogator as claimed in claim 8, wherein the current source is capable of biasing the two or more amplifiers in a linear mode if the power amplifier is operating in a fixed mode of operation.

13. An RFID interrogator as claimed in claim 8, wherein the current source is capable of biasing the two or more amplifiers in a non-linear mode if the power amplifier is operating in a portable mode of operation.

* * * * *